United States Patent [19]

Aiken

[11] 3,964,061
[45] June 15, 1976

[54] SUCCESSIVE APPROXIMATION ANALOG TO DIGITAL CONVERTER

[76] Inventor: Howard H. Aiken, 1511 S. Ocean Drive, Fort Lauderdale, Fla. 33316

[22] Filed: Aug. 26, 1975

[21] Appl. No.: 607,992

Related U.S. Application Data

[60] Continuation of Ser. No. 437,479, Jan. 28, 1974, abandoned, which is a division of Ser. No. 288,957, Sept. 14, 1972, Pat. No. 3,815,144.

[52] U.S. Cl. .......................................... 340/347 AD
[51] Int. Cl.² ........................................ H03K 13/17
[58] Field of Search ............. 340/347 AD; 324/99 D

[56] References Cited
UNITED STATES PATENTS

| | | | |
|---|---|---|---|
| 3,475,749 | 10/1969 | Plice | 340/347 DA |
| 3,505,668 | 4/1970 | Ottesen | 340/347 AD |
| 3,626,407 | 12/1971 | Drangeld | 340/347 AD |

Primary Examiner—Thomas J. Sloyan
Attorney, Agent, or Firm—Cushman, Darby & Cushman

[57] ABSTRACT

A method and apparatus for recording electrical signals on moving paper charts in which the magnitude of the electrical signal is translated into a digital number by a successive approximation type of analog to digital converter. The digital number can be used, as an example, to activate a group of switching elements to select and pass current through one of a plurality of small resistive elements diffused into a semiconducting material. This current causes the selected element to increase temperature to a value sufficient to cause an adjacent thermally sensitive paper to change its state and darken in the small area so heated, thus giving a record on the paper of the discrete position represented by the particular digital number and hence the magnitude of the original electrical signal.

4 Claims, 10 Drawing Figures

SUCCESSIVE APPROXIMATION ANALOG TO DIGITAL CONVERTER

BACKGROUND OF THE INVENTION

This is a continuation of application Ser. No. 437,479 filed Jan. 28, 1974, now abandoned, which was a division of application Ser. No. 288,957, filed Sept. 14, 1972, now U.S. Pat. No. 3,815,144.

In prior art chart recorders a strip of paper is driven past a stylus which is moved in response to an electrical signal. The stylus marks the paper strip which is driven at a controlled speed by a clockwork gear mechanism and a constant-speed motor. Generally, the chart paper is preprinted with division lines perpendicular to the direction of travel to indicate equivalent time intervals. The marking stylus generally is moved perpendicularly to the direction of paper travel by a servomechanism or galvanometer movement in a manner such that the amount of its movement from a reference point is proportional to the magnitude of the electrical signal used to stimulate the stylus movement. Generally, too, the chart paper is preprinted with other divisions, parallel to the paper motion, which provide a set of reference lines to indicate the magnitude of the electrical signal. Means must be provided to adjust the position of the stylus for one value of electrical signal to correspond to the reference point and for at least one other to calibrate the meter to the divisions on the chart paper.

Ink filled and thermal styli are conventionally employed; ordinary paper can be used with the ink indication, while thermally sensitive paper is used with the thermal stylus.

In the first method, ink must flow in a controlled fashion to deposit marking on the paper strip; various means are employed to overcome the inherent limitations. The amount of ink which flows onto the paper is critical: there must be sufficient to mark a visible line and not enough to spread into a line wider than the stylus tip (which would result in reduced accuracy of the meter) or to produce blobs. The viscosity of the ink is thus critical, as well, and it must remain at its critical value over long periods of time. Disposable ink-filled cartridges are used but for many applications the mass and size of these devices are excessive. For these cases, ink is fed to the end of the stylus by means of a pump connecting a reservoir to the stylus end through very small tubing.

For the thermal stylus, the end contacting the paper contains a resistive element through which a current is passed which causes an increase in temperature of the resistive element, thus darkening the thermally sensitive paper. While the thermal stylus avoids some of the problems inherent with respect to an ink stylus as discussed above, it still depends upon a servomechanism or a galvanometer movement.

SUMMARY OF THE INVENTION AND OBJECTS

It is an object of this invention to provide an improved analog to digital converter for converting an analog electrical signal to a digital number.

Briefly, in accordance with one embodiment of the invention, there is provided an input information signal which is converted to a digital number by a successive approximation type of analog to digital converter.

DESCRIPTION OF THE PREFERRED EMBODIMENTS

Figure 1:
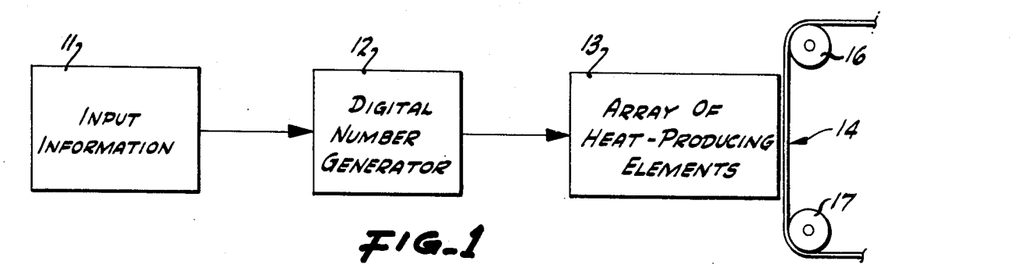
FIG. 1 is a generalized block diagram broadly illustrating one environment in which the analog to digital converter of the present invention can be utilized.

FIG. 1 is a generalized block diagram broadly illustrating one environment in which the analog to digital converter of the present invention can be utilized. The digital number generator 12 in accordance with the present invention is adapted to generate a succession of digital numbers corresponding to and respresenting the input information. The analog to digital converter or digital number generator in accordance with this invention can be used in a variety of environments. One such use is schematically illustrated in FIG. 1. An array of heatproducing elements 13 is provided with a thermally sensitive medium 14 adjacent thereto. The thermally sensitive medium 14 is adapted to be moved past the array of heat producing elements 13, this being schematically indicated by the rollers 16 and 17 in FIG. 1.

In operation each of the successive digital numbers generated by the digital number generator 12 uniquely selects and energizes one of the plurality of heat producing elements in the array 13. The thus energized element produces heat which raises the temperature of that portion of the thermally sensitive medium 14 adjacent to that particular element at that particular time. This temperature rise causes a permanent indication, such as a darkening or color change, to appear on the thermally sensitive medium 14.

The velocity of the thermally sensitive medium 14 past the array of heat producing elements 13 can, of course, be variable if desired. Similarly, a plurality of arrays of heat producing elements can be disposed side by side perpendicular to the direction of travel of the thermally sensitive medium, with a plurality of heat producing elements being simultaneously energized. With appropriate logic circuitry for selecting the heat producing elements to be energized and appropriate circuitry for controlling the velocity of the thermally sensitive medium, virtually any desired kind of permanent indication can be produced on the thermally sensitive medium.

A system and method such as discussed above in connection with FIG. 1 is particularly suitable for recording electrical signals on moving paper such as in a chart recorder. As will be hereinafter described in accordance with this invention translation of an analog electrical signal into a digital form and then utilizing the digital form to select a heat producing element so that a record is formed on a heat sensitive medium, can be accomplished in very short time intervals. The speed of response to an electrical signal is thus several orders of magnitude faster than conventional galvanometer type chart recorders. Moreover, since the basic recording system is essentially solid state as opposed to conventional electromechanical means, the reliability is quite high and will remain high over a prolonged period of time.

Figure 2:
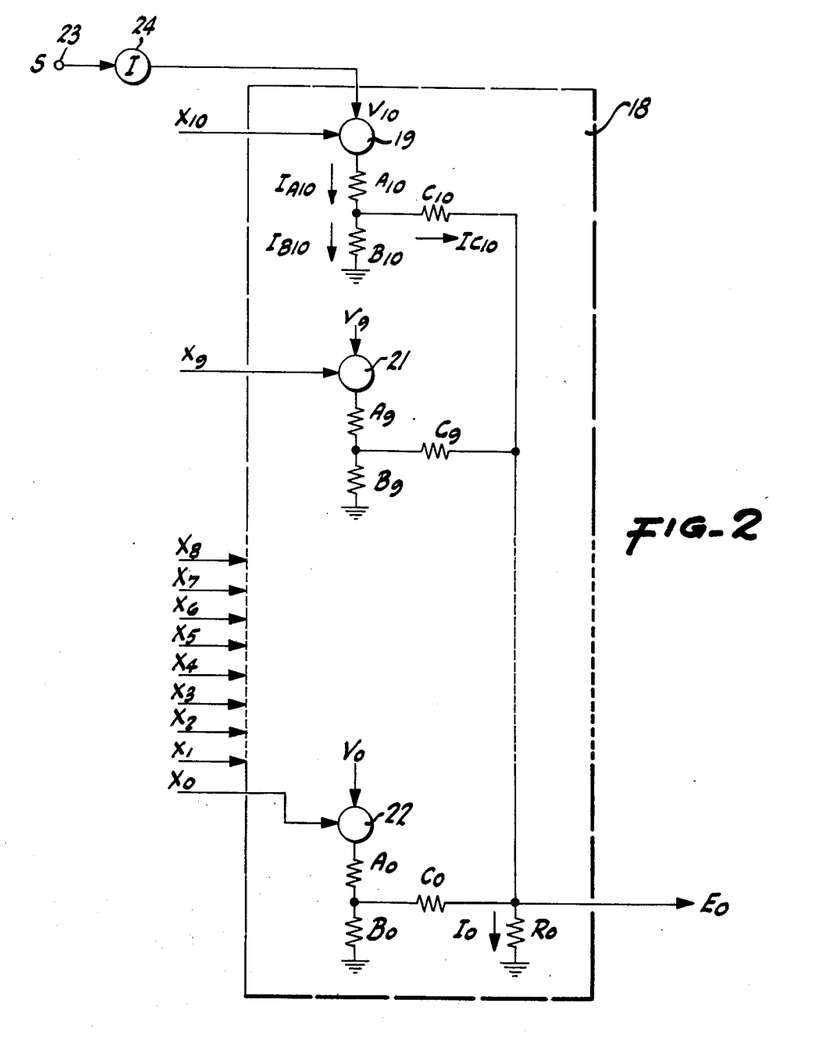
FIG. 2 is a schematic circuit diagram of a group of voltage or current dividers which form part of the means for converting an analog electrical signal to a digital number.

Turning now to a detailed discussion of one embodiment of an analog to digital converter in accordance with the invention, FIG. 2 illustrates a group of voltage or current dividers 18 which form a part of means for converting an analog electrical signal to a digital number. An understanding of the total conversion means and method can best be obtained by first considering only that portion shown in FIG. 2. In FIG. 2 $A_i$, $B_i$ and $C_i$ are resistors in a circuit having 11 branches with $0 \leq i \leq 10$. FIG. 2 only shows three of these branches for $i$ equal to 10, 9 and 0 but it is to be understood that for this particular example eleven such branches are provided. Each of the eleven branches has an associated gate. Thus in FIG. 2 there is shown a gate 19 associated with the $i = 10$ branch, a gate 21 associated with the $i = 9$ branch, and a gate 22 associated with the $i = 0$ branch. Again, although only three gates are shown in FIG. 2 it is to be understood that there are eleven such gates, one for each of the circuit branches. Each of the gates has an input $V_i$ and an input $X_i$. The following generalized current and voltage equations can be written with respect to the $i$th branch:

$$V_i X_i = A_i I_{Ai} + B_i I_{Bi} \quad (1)$$

$$B_i I_{Bi} = C_i I_{Ci} + E_0 \quad (2)$$

$$I_{Ai} = I_{Bi} + I_{Ci} \quad (3)$$

$$\sum_{i=0}^{10} I_{Ci} = I_o \quad (4)$$

$$E_0 = R_0 I_o \quad (5)$$

Here, $V_i$ is the voltage applied to the $i$th branch through its associated gate with the operation of the gate being controlled by the application of the binary switching voltage $X_i = 0,1$ (logical values). Further, $I_{Ai}$, $I_{Bi}$ and $I_{Ci}$ are the currents through the respective resistors $A_i$, $B_i$ and $C_i$, and $E_0$ is the output voltage developed by the current $I_o$ flowing in the arrow direction through the output resistor $R_0$. Substituting equation (3) into equation (1) yields $$(6) \quad V_i X_i = (A_i + B_i) I_{Bi} + A_i I_{Ci}$$

Combining equation (2) with equation (6) then gives $$\frac{B_i}{A_i + B_i} \cdot V_i X_i = \left[ \frac{A_i B_i}{A_i + B_i} + C_i \right] \cdot I_{Ci} + E_0 \quad (7)$$

In equation (7) let $V_{10} = -S$ where S is the signal voltage to be measured. This can be physically achieved through passing the signal voltage S which is present at an input terminal 23 through an inverter 24 as shown in FIG. 2. Also, let $X_{10} = 1$ and let $V_0 = V_1 = V_2 = V_i = \cdots = V_9 = S_m$ where $S_m$ is a voltage such that $0 \leq S \leq S_m$. Summing equation (7) with these conditions over the interval $i$ yields $$S_m \sum_{i=0}^{9} \frac{X_i B_i}{A_i + B_i} - \frac{B_{10}}{A_{10} + B_{10}} S = K \sum_{i=0}^{10} I_{Ci} + 11 E_0 \quad (8)$$

where K is a constant such that $$\frac{A_i B_i}{A_i + B_i} + C_i = K \quad (9)$$

That is, the values of the resistors $A_i$, $B_i$ and $C_i$ in each of the 11 branches are such that K is independent of $i$.

Defining a variable $\sigma_i$ is as follows:

$$\frac{B_i}{A_i + B_i} = \sigma_i = 2^{i-10} \quad (10)$$

The quantities $\sigma_i$ for each of the eleven branches are thus related to each other by powers of 2.

Then equation (8) becomes $$S_m \sum_{i=0}^{9} x_i \sigma_i - S = (K/R_0 + 11) E_0 \quad (11)$$

Values for $A_i$, $B_i$ and $C_i$ are then selected which satisfy equations (9), (10) and (11). Many sets of values for these resistances are possible. If the additional restriction, for example, is imposed that $K = 256$ then an acceptable set of values for $A_i$, $B_i$, $C_i$ and $\sigma_i$ are as given in the following table.

TABLE II

| i | $A_i$ | $B_i$ | $C_i$ | $\sigma_i$ |
|---|-------|-------|-------|-----------|
| 0 | 1023 | 1 | 255.001 | 0.0010 |
| 1 | 1022 | 2 | 254.004 | 0.0020 |
| 2 | 1020 | 4 | 252.016 | 0.0039 |
| 3 | 1016 | 8 | 248.063 | 0.0078 |
| 4 | 1008 | 16 | 240.250 | 0.0156 |
| 5 | 992 | 32 | 225.000 | 0.0313 |
| 6 | 960 | 64 | 196.000 | 0.0625 |
| 7 | 896 | 128 | 144.000 | 0.1250 |
| 8 | 768 | 256 | 64.000 | 0.2500 |
| 9 | 512 | 512 | 0 | 0.5000 |
| 10 | 0 | 1024 | 256.000 | 1.0000 |

Next, let a selection means be provided (as will be hereinafter described) to choose the values of $X_i = 0$ or 1 such that the following two equations are satisfied:

$$E_o = 0 \quad (12)$$

$$S = S_m \sum_{i=0}^{9} x_i \sigma_i \quad (13)$$

The circuit of FIG. 2 then functions as an analog to digital converter for the input S with the values of $X_i$ for satisfying equations (12) and (13) being a digital binary number corresponding to the magnitude of the input S.

To illustrate the manner in which the circuit of FIG. 2 operates, suppose that the input electrical signal S is equal to 0.8340 volts. If $X_9$ through $X_0$ inputs are 0, then the voltage $E_0$ is negative. Next, if $X_9 = 1$ so that the associated gate 21 is closed, but $X_8$ through $X_0$ are 0, then $$\sigma_9 - S = 0.5000 - 0.8340 = -0.3340 \quad (14)$$

so that $E_0$ is still negative. Next, taking $X_8 = 1$ with $X_7$ through $X_0$ still 0, then $$\sigma_9 + \sigma_8 - S = -0.3340 + 0.2500 = -0.0840 \quad (15)$$

so that $E_0$ is still negative. Next, taking $X_7 = 1$ with $X_6$ through $X_0$ still 0, then $$\sigma_9 + \sigma_8 + \sigma_7 - S = -0.0840 + 0.1250 = 0.0410 \quad (16)$$

so that $E_0$ has now become positive. Hence, adding in the value of $\sigma_7$ has caused $E_0$ to go past zero and become positive so that the digital binary equivalent of S = 0.8340 does not include $\sigma_7 = 0.1250$. This process is continued in stepwise fashion until finally $$\sigma_9 + \sigma_8 + \sigma_6 + \sigma_4 + \sigma_2 + \sigma_1 - S = 0 \quad (17)$$

and the conversion is completed. The digital representation of S = 0.8340 is thus represented by the values of $X_9$ through $X_0$ necessary to cause $E_0$ to be equal to zero which in accordance with equation 17 are 1101010110 where the first digit corresponds to $X_9$, the second to $X_8$, the third to $X_7$ and so forth.

Of course the circuit arrangement shown in FIG. 2 is only adapted to digitally convert an input signal having a magnitude within a defined range. For example, the specific circuit arrangement shown in FIG. 2 is adapted to digitally convert an input signal within the range 0 to approximately 0.999 volts. Different voltage ranges can, of course, be covered by changing the values of $A_i$, $B_i$ and $C_i$. Also, for example, a circuit could be provided similar to that of FIG. 2 but having less than or more than eleven branches, depending upon the number of binary digits desired in the generated digital number.

Figure 3:
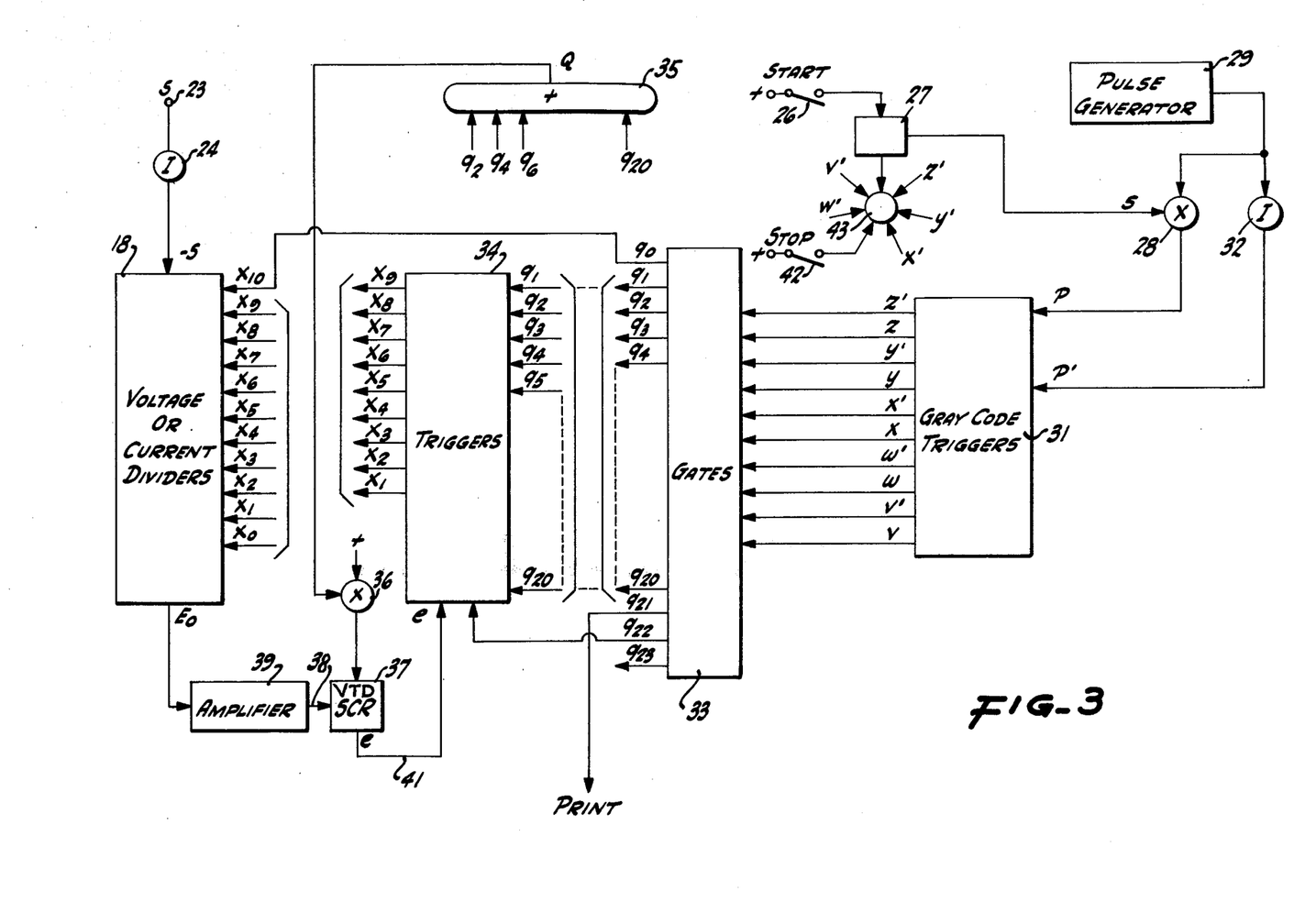
FIG. 3 is a block diagram of the overall means for converting an analog electrical signal to a digital number.

Turning now to a consideration of FIG. 3, there is shown in block diagram form the overall circuitry for converting an analog electrical signal to a digital number. FIG. 3 includes in block diagram form the group of voltage or current dividers 18 and the inverter 24 for inverting the input signal present at the terminal 23. In FIG. 3 a start switch 26 is provided which when closed puts a trigger 27 in the 1-state thus closing a start (AND) gate 28. Closure of the start gate 28 allows p pulses from a pulse generator 29 to flow into a group of Gray code triggers 31. The pulse generator 29 provides a continuous sequence of square wave pulses, for example, which define a basic clock rate for the circuits shown in FIG. 3. An inverter 32 is also provided for providing an inverted $p'$ pulses as inputs to the group of Gray code triggers 31.

The group of Gray code triggers 31 has ten outputs labeled $v$ through $Z$ and $V'$ through $z'$. The group of Gray code triggers 31 cycles these outputs through twenty-four states defined by a suitable Gray code. The signals $v$ through $z$ and $y'$ through $z'$ as they are cycled through an appropriate Gray code are translated by a group of gates 33 into 24 sequential outputs $q_0$ through $q_{23}$. These $q_0$ through $q_{23}$ pulses drive a group of triggers 34 which are used to control the analog to digital conversion process.

The even numbered $q_2$ through $q_{20}$ also form inputs to an OR gate 35. The output Q of the OR gate 35 closes and AND gate 36 which energizes a voltage threshold detector or a silicon controlled rectifier 37. The voltage threshold detector or silicon controlled rectifier 37 receives as its input on a circuit 38 the signal $E_0$ which may be amplified by a suitable amplifier 39. The voltage threshold detector or silicon controlled rectifier 37 remains cut off until its input signal, the amplified $E_0$, exceeds a prescribed limit by a few microvolts. Thereafter, it conducts heavily until the power to it is interrupted. The output of the voltage threshold detector or silicon controlled rectifier 37 on a circuit 41 is a signal e which is connected to the group of triggers 34.

In operation, the $q_0$ pulse causes signal $X_{10}$ to change to the 1-state so that the input signal $-S$ is applied to the group of voltage or current dividers 18. Next, the $q_1$ pulse changes the signal $X_9$ to the 1-state acting through the triggers 34. Output Q of the OR gate 34 is then changed to the 1-state by the $q_2$ pulse. This energizes the voltage threshold detector or silicon controlled rectifier 37 which, as discussed before, receives its input from $E_0$ after amplification by amplifier 39. The $q_2$ pulse is also applied to the triggers 34 as well as the e signal, which is the output of the voltage threshold detector or silicon controlled rectifier 37. If $\sigma_g$ of the group of voltage or current dividers 18 is less than the signal $-S$, the $E_0$ remains negative, and the voltage threshold detector or silicon controlled rectifier 37 does not conduct so that its output e is zero. For this situation the signal $X_9$ remains in the 1-state. If, on the other hand, the $\sigma_g$ of the group of voltage or current dividers 18 is greater than the signal $-S$, then $E_0$ becomes positive, voltage threshold detector or silicon controlled rectifier 37 does conduct and its output e is positive. For this situation the triggers 34 in response to pulse $q_2$ and pulse e reset the signal $X_9$ to the 0-state. For either case, that is $X_9 = 1$ or 0, this same kind of setting and/or resetting of the $X_8$ through $X_0$ signals continues until pulses $q_{19}$ and $q_{20}$ have established the appropriate value of signal $X_0$. The thus established values of $X_9$ through $X_0$ define a digital binary number which corresponds to and represents the analog signal S.

After the values of $X_9$ through $X_0$ have been determined as discussed above, pulse $q_{21}$ initiates printing and pulse $q_{22}$ resets the group of triggers 34 in preparation for the next cycle. Pulse $q_{23}$ is not used for anything. This action of the various pulses $q_0$ through $q_{23}$ is summarized in the following Table II.

TABLE II

| PULSE | RESULTS |
| --- | --- |
| $q_0$ | null |
| $q_1$ | $X_9 = 1$ |
| $q_2$ | $X_9 = 0$ if e = 1 |
| $q_3$ | $X_8 = 1$ |
| $q_4$ | $X_8 = 0$ if e = 1 |
| $q_5$ | $X_7 = 1$ |
| $q_6$ | $X_7 = 0$ if e = 1 |
| $q_7$ | $X_6 = 1$ |
| $q_8$ | $X_6 = 0$ if e = 1 |
| $q_9$ | $X_5 = 1$ |
| $q_{10}$ | $X_5 = 0$ if e = 1 |
| $q_{11}$ | $X_4 = 1$ |

TABLE II-continued

| PULSE | RESULTS |
|---|---|
| $q_{12}$ | $X_4 = 0$ if $e = 1$ |
| $q_{13}$ | $X_3 = 1$ |
| $q_{14}$ | $X_3 = 0$ if $e = 1$ |
| $q_{15}$ | $X_2 = 1$ |
| $q_{16}$ | $X_2 = 0$ if $e = 1$ |
| $q_{17}$ | $X_1 = 1$ |
| $q_{18}$ | $X_1 = 0$ if $e = 1$ |
| $q_{19}$ | $X_0 = 1$ |
| $q_{20}$ | $X_0 = 0$ if $e = 1$ |
| $q_{21}$ | PRINT |
| $q_{22}$ | Reset triggers 34 |
| $q_{23}$ | Blank |

Referring to FIG. 3 again, a stop switch 42 is provided. After the start switch 26 is closed the trigger 27 is set to the 1-state so that the AND gate 28 is on, allowing p pulses from the pulse generator 29 to be applied to the Gray code triggers 31. The Gray code triggers 31 cycle through 24 states as discussed before and continue to cycle through these twenty four states until the stop switch 42 is closed. An AND gate 43 is provided having six inputs. These six inputs are respectively the stop switch 42, $v'$, $w'$, $x'$, $y'$ and $z'$. The values of $v'$, $w'$, $x'$, $y'$ and $z'$ all equal to the 1- state correspond to the first of the twenty four states of the Gray code triggers 31. The first time the Gray code triggers 31 reach this state after the stop switch 42 is closed, the trigger 27 is reset so that AND gate 28 is disabled and the p pulses to the Gray code triggers 31 are terminated.

Figure 4:
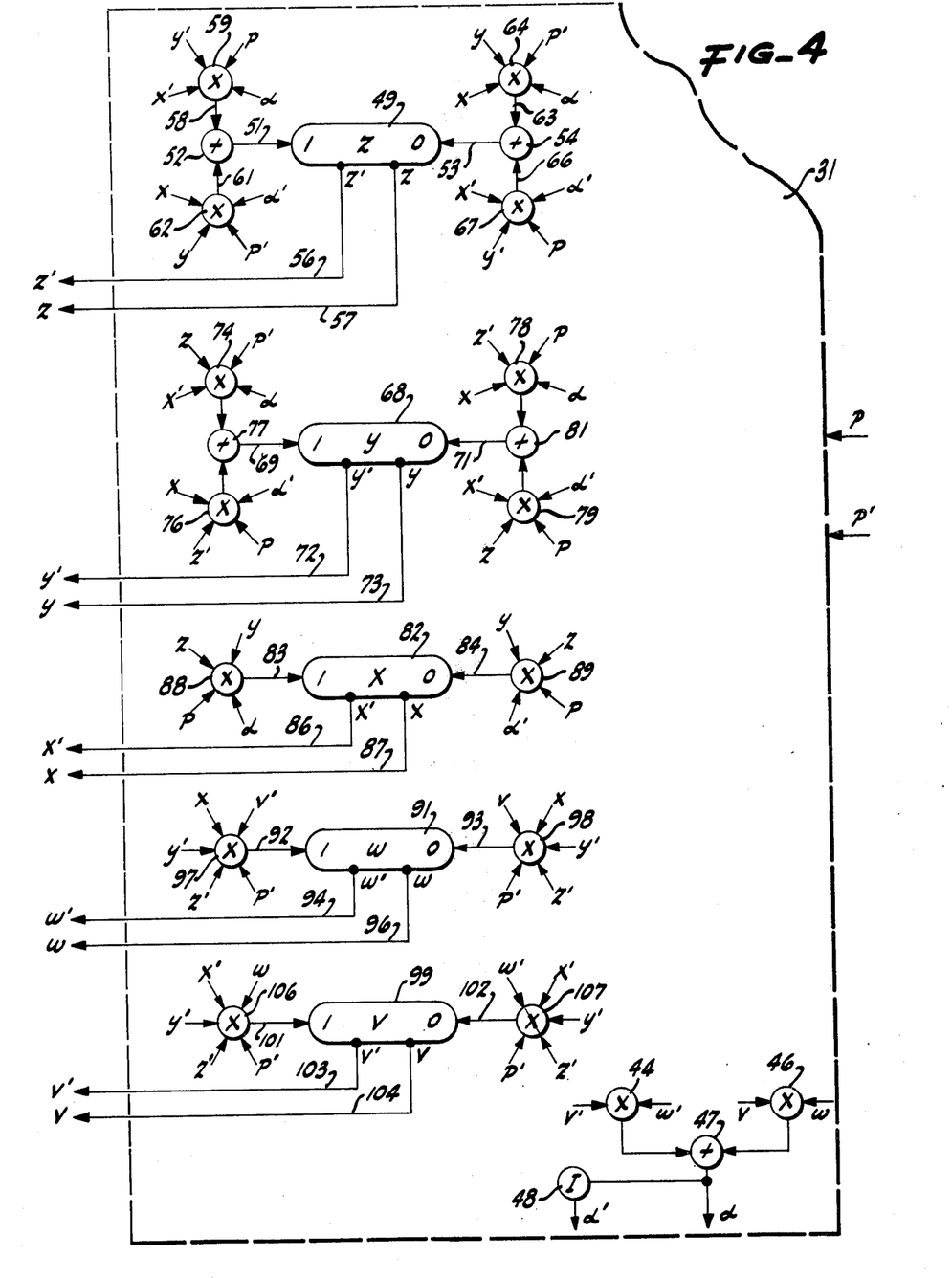
FIG. 4 is a schematic diagram of the Gray code triggers in FIG. 3.

Referring now to FIG. 4, there is shown in detail the individual triggers within the Gray code triggers 31 of FIG. 3. The Gray code triggers 31 cycle the outputs $v$ through $z$ and $v'$ through $z'$ through 24 states in response to the inputs $p$ and $p'$ in accordance with the following Table III.

TABLE III

| Cycle | v | w | x | y | z | p |
|---|---|---|---|---|---|---|
| 0 | 0 | 0 | 0 | 0 | 0 | 0 |
| 1 | 0 | 0 | 0 | 0 | 1 | 1 |
| 2 | 0 | 0 | 0 | 1 | 1 | 0 |
| 3 | 0 | 0 | 1 | 1 | 1 | 1 |
| 4 | 0 | 0 | 1 | 1 | 0 | 0 |
| 5 | 0 | 0 | 1 | 0 | 0 | 1 |
| 6 | 0 | 1 | 1 | 0 | 0 | 0 |
| 7 | 0 | 1 | 1 | 1 | 0 | 1 |
| 8 | 0 | 1 | 1 | 1 | 1 | 0 |
| 9 | 0 | 1 | 0 | 1 | 1 | 1 |
| 10 | 0 | 1 | 0 | 0 | 1 | 0 |
| 11 | 0 | 1 | 0 | 0 | 0 | 1 |
| 12 | 1 | 1 | 0 | 0 | 0 | 0 |
| 13 | 1 | 1 | 0 | 0 | 1 | 1 |
| 14 | 1 | 1 | 0 | 1 | 1 | 0 |
| 15 | 1 | 1 | 1 | 1 | 1 | 1 |
| 16 | 1 | 1 | 1 | 1 | 0 | 0 |
| 17 | 1 | 1 | 1 | 0 | 0 | 1 |
| 18 | 1 | 0 | 1 | 0 | 0 | 0 |
| 19 | 1 | 0 | 1 | 1 | 0 | 1 |
| 20 | 1 | 0 | 1 | 1 | 1 | 0 |
| 21 | 1 | 0 | 0 | 1 | 1 | 1 |
| 22 | 1 | 0 | 0 | 0 | 1 | 0 |
| 23 | 1 | 0 | 0 | 0 | 0 | 1 |

Table III is, of course, merely an example of a suitable Gray code. Any arrangement could be utilized for generating a cycle of twenty four states from a string of continuous input pulses. Reading from Table III, the gating functions required to pull the trigger z into the states 1 and 0, respectively, are $$Z_1 = v'w'x'y'p + v'w\,x\,y\,p' + v\,w\,x'y'p + v\,w'\,x\,y\,p \quad (18)$$
$$Z_0 = v'w'x\,y\,p' + v'w\,x'y'p + v\,w\,x\,y\,p' + v\,w'x'y'p \quad (19)$$

Similarly;

$$Y_1 = v'w'x'z\,p' + v'w\,x\,z'p + v\,w\,x'z\,p' + v\,w'x\,z'p \quad (20)$$
$$Y_0 = v'w'x\,z'p + v'w\,x'z\,p' + v\,w\,x\,z'p + v\,w'x'z\,p' \quad (21)$$
$$X_1 = v'w'y\,z\,p + v\,w\,y\,z\,p \quad (22)$$
$$X_0 = v'w\,y\,z\,p + v\,w'y\,z\,p \quad (23)$$
$$W_1 = v'x\,y'z'p' \quad (24)$$
$$W_0 = v\,x\,y'z'p' \quad (25)$$
$$V_1 = w\,x'y'z'p' \quad (26)$$
$$V_0 = w'x'y'z'p' \quad (27)$$

It a quantity $a$ is defined where $$\alpha = w'x' + w\,x \quad (28)$$

than equations (18) through (27) can be simplified to read as follows:

$$Z_1 = x'y'p\alpha + x\,y\,p'\,\alpha' \quad (29)$$
$$Z_0 = x\,y\,p'\alpha + x'y'\,p\,\alpha' \quad (30)$$
$$Y_1 = x'z\,p'\alpha + x\,z'\,p\,\alpha' \quad (31)$$
$$Y_0 = x\,z'\,p\,\alpha + x'z\,p\,\alpha' \quad (32)$$
$$X_1 = y\,z\,p\,\alpha \quad (33)$$
$$X_0 = y\,z\,p\,\alpha' \quad (34)$$
$$W_1 = v'x\,y'z'p' \quad (35)$$
$$W_0 = v\,x\,y'z'p' \quad (36)$$
$$V_1 = w\,x'y'z'p' \quad (37)$$
$$V_0 = w'x'y'z'p' \quad (38)$$

The circuitry shown in FIG. 4 is an implementation of equations (28) through (38). For the sake of clarity, rather than show all the various internal connections within the Gray code triggers 31, the various inputs and outputs of each of the circuit elements have been labeled. Thus in FIG. 4 the circuitry for generating the quantity $\alpha$ of equation (28) includes an AND gate 44 having inputs of $v'$ and $w'$ and an AND gate 46 having inputs of $v$ and $w$. The outputs of AND gates 44 and 46 are inputs to an OR gate 47, the output of which is the desired quantity $\alpha$. An inverter 48 is also provided for generating the quantity $\alpha'$ from the quantity $\alpha$. A z trigger 49 is provided having a transfer to 1-state input on circuit 51 from OR gate 52 and a transfer to 0-state input on circuit 53 from OR gate 54. The Z trigger 49 also has outputs of $z'$ on circuit 56 and $z$ on circuit 57. The OR gate 52 has an input on circuit 58 from AND gate 59 and an input on circuit 61 from AND gate 62. The inputs to AND gate 58 are the quantities in the first term of equation (29), i.e. $x'$, $y'$, $p$ and $\alpha$; and the inputs to AND gate 62 are the quantities in the second term of equation (29), i.e., $x$, $y$, $p'$ and $\alpha'$. In a similar fashion the OR gate 54 has inputs on circuit 63 from an AND gate 64 and on circuit 66 from an AND gate 67. The inputs to AND gate 64 are then the quantities in the first term of equation (30) and the inputs to AND gate 67 are the quantities in the second term of equation (30).

Equations (31) through (38) are implemented in a similar fashion. Thus a y trigger 68 is provided having a transfer to 1-state input on circuit 69, a transfer to 0-state input on circuit 71, as well as $y'$ and $y$ outputs on circuits 72 and 73, respectively. Two AND gates 74 and 76 and an OR gate 77 are provided for implementing equation (31), and two AND gates 78 and 79 and an OR gate 81 are provided for implementing equation (32).

Likewise, an X trigger 82 is provided having a transfer to 1-state input on circuit 83, a transfer to 0-state input on circuit 84, as well as $x'$ and $x$ outputs on circuits 86 and 87, respectively. An AND gate 88 is provided for implementing equation (33) and an AND gate 89 is provided for implementing equation (34).

A $w$ trigger 91 is also provided having a transfer to 1-state input on a circuit 92, a transfer to 0-state input on a circuit 93, as well as $w'$ and $w$ outputs on circuits 94 and 96, respectively. An AND gate 97 is provided for implementing equation (35) and an AND gate 98 is provided for implementing equation (36).

Finally, a $v$ trigger 99 is provided having a transfer to 1-state input on circuit 101, a transfer to 0-state input on circuit 102, as well as $v'$ and $v$ outputs on circuits 103 and 104, respectively. An AND gate 106 is provided for implementing equation (37) and an AND gate 107 is provided for implementing equation (38).

Figure 5:
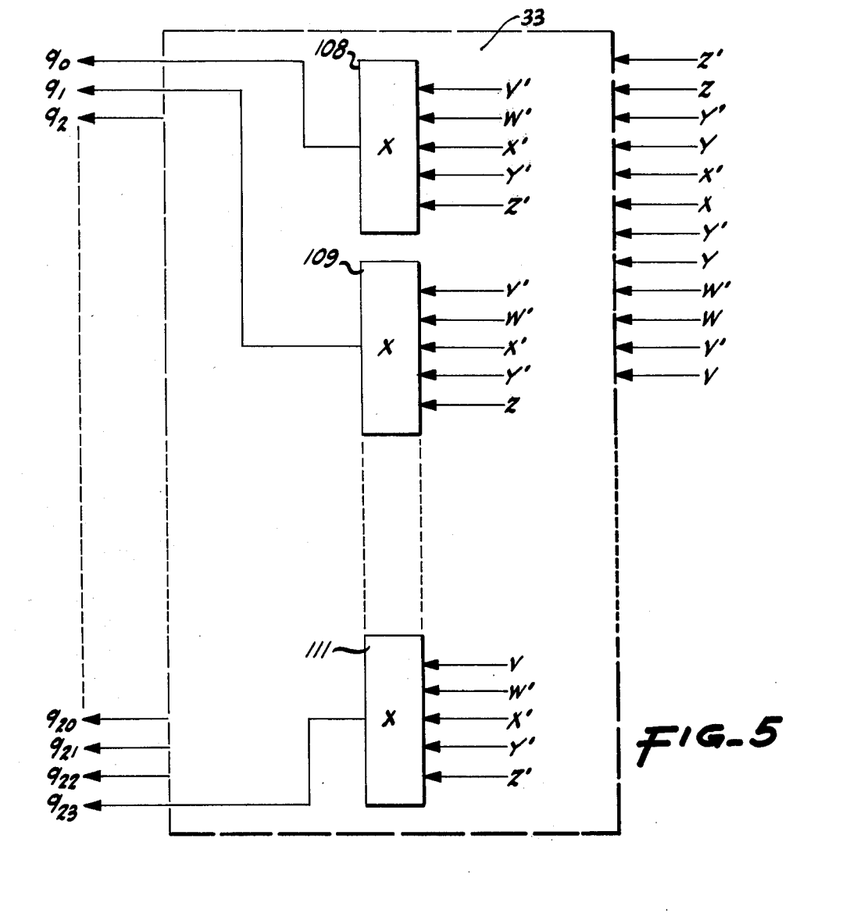
FIG. 5 is a schematic diagram of the gates of FIG. 3.

Turning now to a consideration of FIG. 5, there is shown portions of the circuitry of the gates 33, indicating how the $v, v', w, w', x, x', y, y', z$, and $z'$ outputs of the Gray code triggers 31 are used to generate the pulses $q_0$ through $q_{23}$ in accordance with the following equations derived from Table III.

$$q_0 = v'w'x'y'z' \quad (39)$$
$$q_1 = v'w'x'y'z \quad (40)$$
$$q_2 = v'w'x'y\,z \quad (41)$$
$$q_3 = v'w'x\,y\,z \quad (42)$$
$$q_4 = v'w'x\,y\,z' \quad (43)$$
$$q_5 = v'w'x\,y'z' \quad (44)$$
$$q_6 = v'w\,x\,y'z' \quad (45)$$
$$q_7 = v'w\,x\,y\,z' \quad (46)$$
$$q_8 = v'w\,x\,y\,z \quad (47)$$
$$q_9 = v'w\,x'y\,z \quad (48)$$
$$q_{10} = v'w\,x'y'z \quad (49)$$
$$q_{11} = v'w\,x'y'z' \quad (50)$$
$$q_{12} = v\,w\,x'y'2' \quad (51)$$
$$q_{13} = v\,w\,x'y'z \quad (52)$$
$$q_{14} = v\,w\,x'y\,z \quad (53)$$
$$q_{15} = v\,w\,x\,y\,z \quad (54)$$
$$q_{16} = v\,w\,x\,y\,z' \quad (55)$$
$$q_{17} = v\,w\,x\,y'z' \quad (56)$$
$$q_{18} = v\,w'x\,y'z' \quad (57)$$
$$q_{19} = v\,w'x\,y\,z' \quad (58)$$
$$q_{20} = v\,w'x\,y\,z \quad (59)$$
$$q_{21} = v\,w'x'y\,z \quad (60)$$
$$q_{22} = v\,w'x'y'z \quad (61)$$
$$q_{23} = v\,w'x'y'z' \quad (62)$$

Gates 33 include twenty four separate AND gates, with the outputs of these AND gates corresponding to the signals $q_0$ through $q_{23}$, respectively. Only three of these AND gates are specifically illustrated in FIG. 5. Thus AND gate 108 has an output $q_0$ and five inputs $v', w', x', y'$ and $z'$, all in accordance with equation (39). Similarly, AND gate 109 has an output $q_1$ and five inputs $v', w', x', y'$ and $z$, all in accordance with equation (40). Gates (not shown) are also provided having outputs $q_2$ through $q_{22}$ and having inputs in accordance with equations (41) through (61). FIG. 5 does illustrate an AND gate 111 having $q_{23}$ as its output and having five inputs $v, w', x', y'$ and $z'$ in accordance with equation (62).

Figure 6:
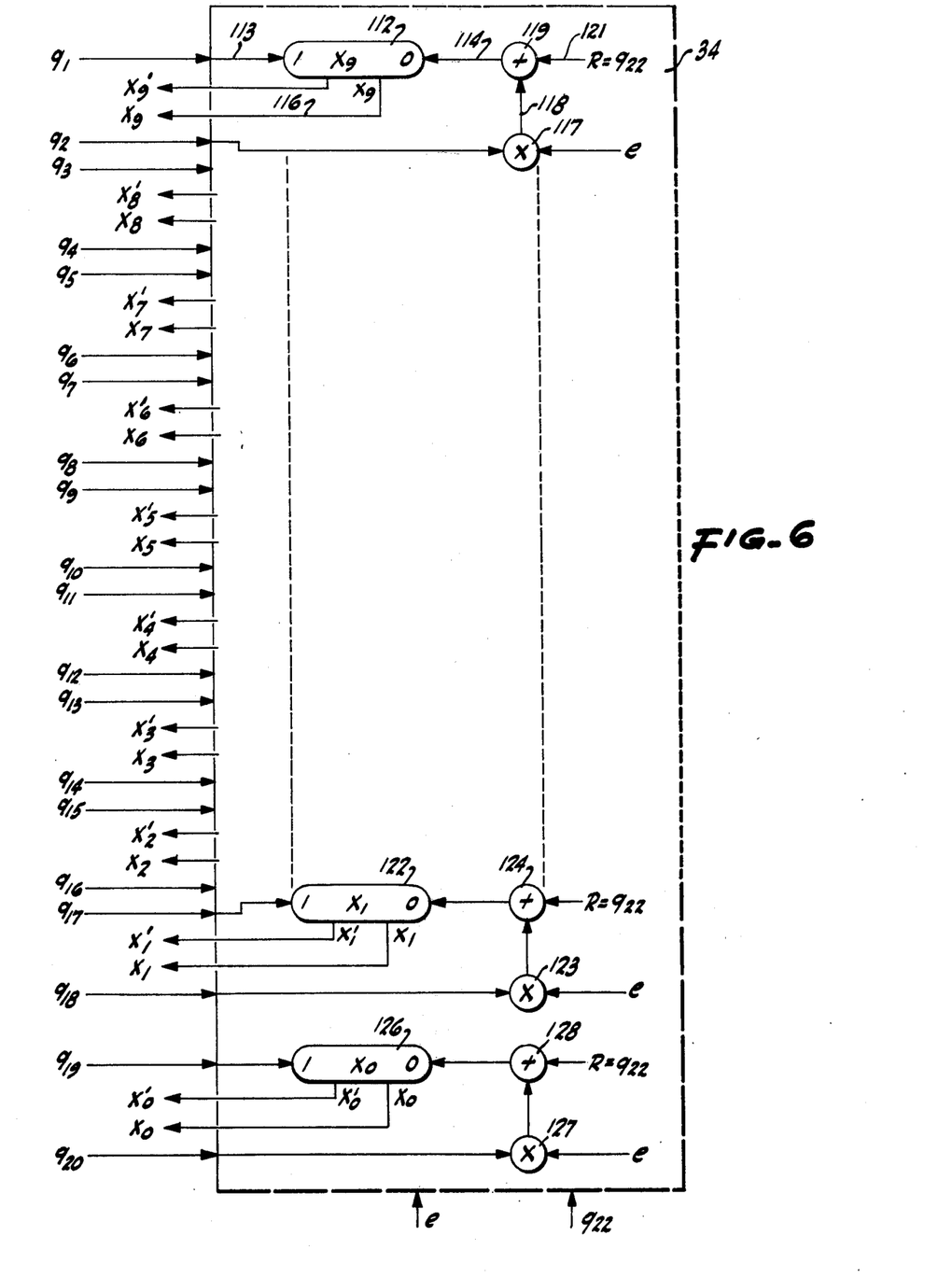
FIG. 6 is a schematic diagram of the triggers of FIG. 3.

Turning now to a consideration of FIG. 6, there is shown in some detail the logic elements in the triggers 34 of FIG. 3. An $x_9$ trigger 112 is provided which has a transfer to 1-state input on circuit 113 and a transfer to 0-state input on circuit 114, as well as an $x_9$ output on circuit 116. The pulse $q_1$ is applied to circuit 113 for setting $x_9$ trigger 112 to the 1-state so that $x_9 = 1$. The $q_2$ pulse as well as the pulse $e$ form inputs to an AND gate 117. The $e$ pulse or signal is derived from the voltage threshold detector or silicon controlled rectifier 37 discussed before in connection with FIG. 3. The output of AND gate 117 on circuit 118 is coupled through an OR gate 119 to the circuit 114 at the transfer to 0-state input of $x_9$ trigger 112. Thus if the $e$ signal exists at the same time pulse $q_2$ is applied, the trigger 112 is reset to the 0-state. A reset circuit 121 also forms an input to the OR gate 119 so that application of pulse $q_{22}$ also resets trigger 112 to the 0-state.

Identical circuitry is provided for generating the signals $x_8$ through $x_0$. Only two such other circuits, those for $x_1$ and $x_0$, are shown in FIG. 6. Thus an $x_1$ trigger 122 is provided with an associated AND gate 123 and OR gate 124 connected as shown in a fashion identical to that of the trigger circuitry for $x_9$ discussed above. Pulse $q_{17}$ thus sets trigger 122 to the 1-state and the simultaneous presence of pulse $q_{18}$ and pulse $e$ (or the reset pulse $q_{22}$) resets trigger 122 to the 0-state. Likewise, an $x_0$ trigger 126 is provided with an associated AND gate 127 and an OR gate 128. Pulse $q_{19}$ sets trigger 126 to the 1-state and the simultaneous presence of pulse $q_{20}$ and pulse $e$ (or the reset pulse $q_{22}$) resets trigger 126 to the 0-state.

Figure 7:
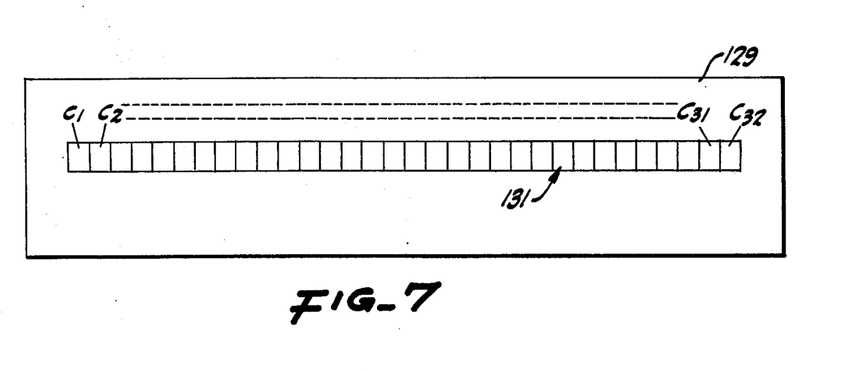
FIG. 7 is a top plan view of an array of heat producing elements.

Thus what has been described in accordance with the invention is circuitry for converting an analog electrical signal S into a ten digit binary digital number represented by the values of $X_9$ through $X_0$. Utilizing the principles and circuits discussed obviously the signal S could be converted into a digital number having fewer or greater than ten digits. What will now be discussed is one example of a typical environment in which the analog to digital converter of this invention can be utilized in a system for making a record on a thermally sensitive medium. Referring to FIG. 7, there is shown a top plan view in schematic fashion of an array of heat-producing elements. There is provided a substrate 129 which may be ceramic, for example, and which has a plurality of integrated circuits generally indicated by reference numeral 131 mounted thereon in adjacent relationship to one another. In this one embodiment 1024 printing positions are provided with there being provided 32 of the individual integrated circuits C1, C2, C3, etc., and with each of the individual integrated circuits having 32 resistor-diode combinations, each of which define a printing position as more fully discussed hereinafter. The substrate 129 is suitably mounted so that a thermally sensitive medium, such as thermally sensitive paper, is driven by means such as a synchronous motor to touch these printing positions at constant speed. Printing positions may be formed by meansoother than integrated circuits on a ceramic substrate. For example, tantalum resistors might be deposited on a substrate or other known means of forming resistors on a substrate can be utilized.

Figures 8, 9:
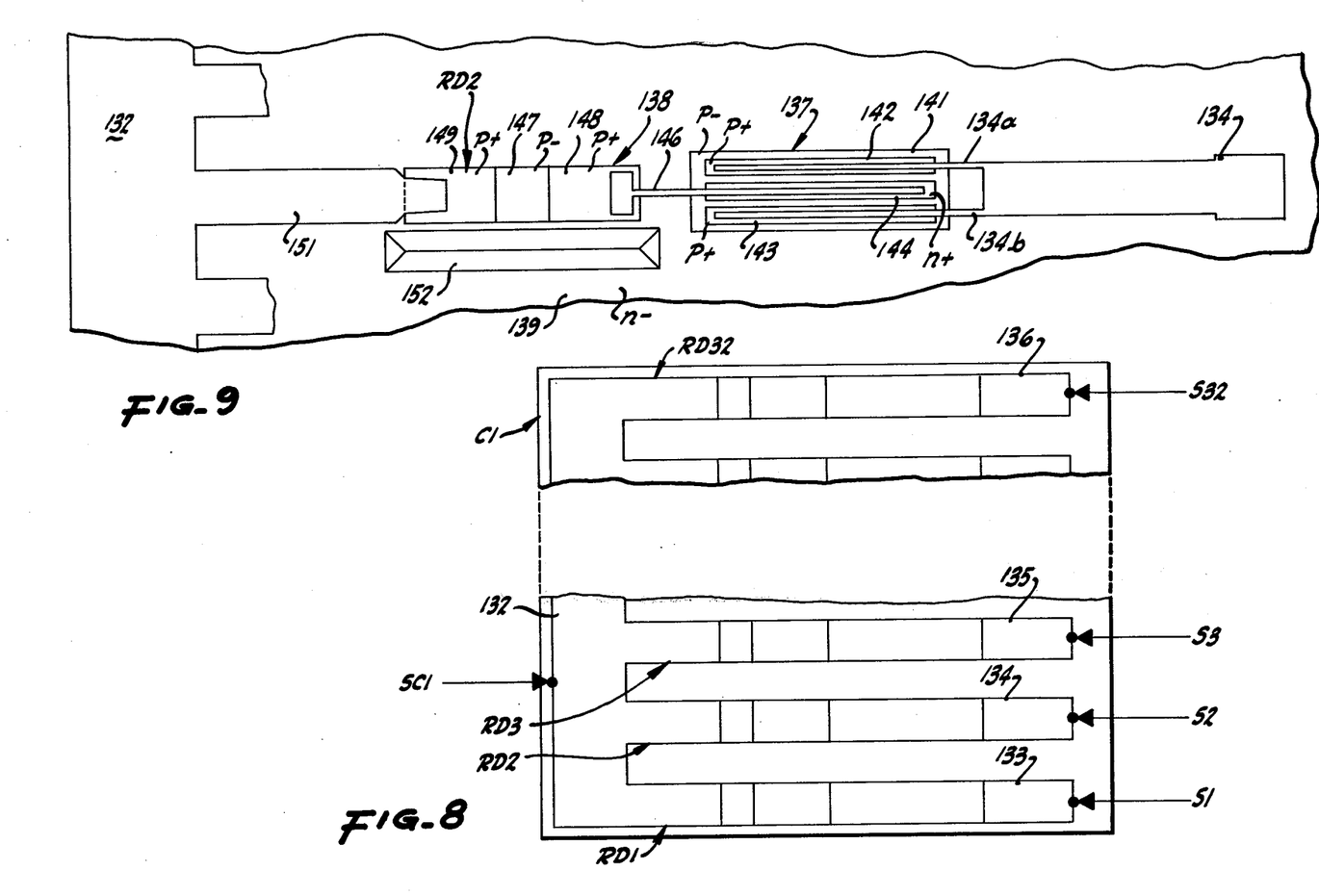
FIG. 8 is a top plan view of one of the integrated circuits of FIG. 7.
FIG. 9 is a top plan view of the resistor diode combination RD2 of FIG. 8.

FIG. 8 is a top plan view of one of the integrated circuits of FIG. 7 and illustrating a portion of the resistor diode combinations thereon. Thus, for example, the integrated circuit C1 has 32 resistor diode combinations RD 1 through RD 32. All 32 resistor diode combinations are connected at one end to a common electrode 132 and are connected at their other ends to individual electrodes. Thus in FIG. 8 resistor diode combination RD 1 is connected to electrode 133, RD 2 is connected to electrode 134, RD 3 is connected to electrode 135 and so on with RD 32 being connected to electrode 136. Each of the electrodes 133, 134, 135, etc. are respectively connected to circuits shown schematically in FIG. 8 and labeled S1, S2, etc., through S32. As further shown in FIG. 8, the common electrode 132 is connected to a circuit shown schematically and labeled SC1.

Turning now to FIG. 9, there is shown a top plan view of the resistor diode combination RD 2 of FIG. 8. As shown in FIG. 9, the resistor diode combination RD 2 includes a diode 137 and a resistor 138 formed in the n-type substrate 139. The diode 137 comprises a p- bed diffusion 141 into which are diffused or otherwise suitably formed p+ areas 142 and 143 and n+ area 144. The p+ areas 142 and 143 serve as the anode, for example, of diode 137 and are contacted by metallization 134a and 134b which are extensions of the electrode 134. The n+ area 144 then serves as the cathode of diode 137 and is contacted by metallization 146. The resistor 138 includes a resistive element p— area 147 with adjacent conductive strip p+ areas 148 and 149. Conductive strip p+ area 148 is connected to the anode of diode 137 by metallization 146 and conductive strip p+ area 149 is connected to common electrode 132 by metallization 151.

Current is conducted through the resistor diode combination RD 2 in response to a voltage applied between common electrode 132 and electrode 134. Such current causes the resistive element p— area 147 to generate heat, thus rising in temperature. Such temperature rise serves to darken the portion of thermally sensitive paper adjacent p— area 147 at that time. FIG. 9 also shows a groove 152 etched into the substrate 139 adjacent resistor 138. Such grooves can be provided between all the resistive elements on a particular substrate in order to localize rises in temperature; that is, to provide a longer thermal path through the substrate between adjacent resistive elements so that a temperature rise of one such resistive element is not communicated to adjacent resistive elements. Each of the resistive element p— areas are approximately 0.005 inches square and are located on 0.010 inches centers. There are thus 100 heat producing spots per inch, resulting in a high resolution indication of an incoming signal S on a thermally sensitive medium. In the specific embodiment discussed herein there are a total of 1,024 such heat producing spots.

Figure 10:
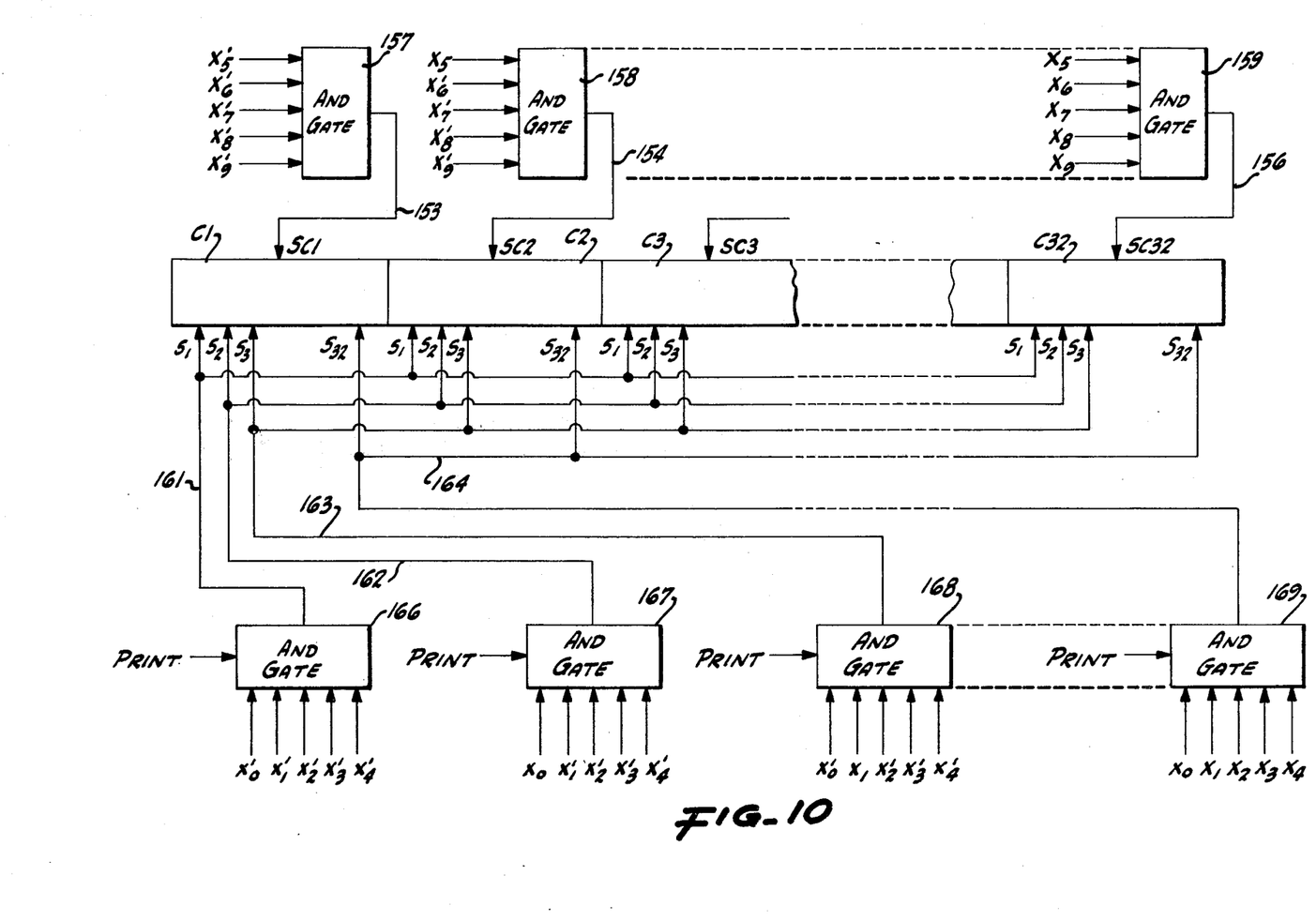
FIG. 10 is a schematic diagram of portions of the integrated circuits of FIG. 7 illustrating electrical connections and logic circuitry.

FIG. 10 is a schematic diagram of portions of the integrated circuits of FIG. 7, illustrating electrical connections to the integrated circuits along with some of the logic circuitry for selecting and energizing one of the resistor-diode heat producing elements therein. Each of the integrated circuits has thirty three electrical connections thereto. An individual one of the integrated circuits C1 through C32 is selected by a signal on one of their respective inputs SC1 through SC32.

Thus integrated circuit C1 is selected by a signal SC1 on a circuit 153, integrated circuit C2 is selected by a signal SC2 on a circuit 154 and so on, with integrated circuit C32 being selected by a signal SC32 on a circuit 156. The signals SC1, SC2, etc., are applied to the electrode common to all the resistor diode combinations within the respective integrated circuits. Each of the circuits 153, 154, etc., over which the signals SC1 through SC32 are applied to the integrated circuits is the output of a logical AND gate. Thus in FIG. 10 an AND gate 157 is shown having SC1 as its output, an AND gate 158 having SC2 as its output, and an AND gate 159 having SC32 as its output. Although only these three AND gates are shown in FIG. 10, it should be understood that there are thirty two such AND gates, one for each of the integrated circuits C1 through C32. Each of the AND gates has five inputs, with these five inputs being selected from among the $X_5$ through $X_9$ and $X_5'$ through $X_9'$, outputs of the triggers shown in FIG. 6. Thus signal SC1 is applied to integrated circuit C1 when the inputs to AND gate 157, which are $X_5'$, $X_6'$, $X_7'$, $X_8'$, and $X_9'$, are all equal to a logical 1-value. This corresponds to a five digit binary number generated by the circuitry of FIG. 2 for the $X_5$ through $X_9$ digits of 00000. Succeeding AND gates for applying signals SC2 through SC32 to integrated circuits C1 through C32 are selected by succeeding values of $X_5$ through $X_9$ with each of the binary numbers thus represented being increased in count by one over the previous number. Thus signal SC2 is applied to integrated circuit C2 when the signals $X_5$, $X_6'$, $X_7'$, $X_8'$ and $X_9'$, are all equal to a logical 1 value. This corresponds to a binary number of 10000. Signal SC3 is applied to integrated circuit C3 in response to $X_5'$, $X_6$, $X_7'$, $X_8'$, and $X_9'$, all equal to 1-value, corresponding to a binary number of 01000. This same sequence continues with signal SC32 being applied to integrated circuit C32 in response to $X_5$, $X_6$, $X_7$, $X_8$ and $X_9$ all equal to 1-value, corresponding to a binary 11111. Thus in this manner the values of $X_5$ through $X_9$ are used to select one of the thirty two integrated circuits C1 through C32.

Each of the integrated circuits C1 through C32 also has thirty two other terminals over which signals S1, S2, etc., through S32 are applied. These signals serve to select a particular one of the 32 resistor diode combinations on an integrated circuit. As shown in FIG. 10, there is provided a circuit 161 for applying S1 to all the integrated circuits, a circuit 162 for applying S2 to all the integrated circuits, a circuit 163 for applying S3 to all integrated circuits, and so on through a circuit 164 for applying S32 to all the integrated circuits. Each of the signals S1 through S32 is the output of a logical AND gate. As shown in FIG. 10, the signals S1, S2, S3 and S32 are the outputs of AND gates 166, 167, 169, respectively. Although only these four AND gates are shown, it should be understood that there are thirty two such AND gates, one for each of the signals S1 through S32. Each of these AND gates has five inputs which are selected from the signals $X_0$ through $X_4$ and $X_0'$ through $X_4'$ of the circuitry of FIG. 6. The AND gate 166 has inputs of $X_0'$, $X_1'$, $X_2'$, $X_3'$, and $X_4'$ so that signal S1 is applied to the integrated circuits when the values of $X_0$ through $X_4$ as determined by the circuitry of FIG. 2 correspond to a binary 00000. Signal S2 is applied when the values of $X_0$ through $X_4$ correspond to a binary 10000; S3 is applied when the values of $X_0$ through $X_4$ correspond to a binary 01000 and so on until S32 is applied when the values of $X_0$ through $X_4$ correspond to a binary 11111. The AND gates for selecting S1 through S32 all also have a PRINT input, which is the pulse $q_{23}$ generated by the gates of FIG. 5.

Thus by the selection process described, a particular voltage input selects one resistive element among the array of 1,024, with the particular resistive element being selected by the digital number corresponding to the values of $X_0$ through $X_9$. The selected resistive element is energized on a PRINT command to cause a darkening of adjacent thermally sensitive record means. By reason of the particular spot position on the record means corresponding to the particular spot formed, an indication is presented representing the magnitude of the voltage presented to the meter.

Although a particular embodiment of the analog to digital converter of this invention has been shown and described, it should be obvious to those skilled in the art that various modifications and substitutions can be made without departing from the true spirit and scope of the invention.

I claim:

1. An analog to digital converter for converting an analog electrical voltage to a digital number comprising a plurality of (0 to $i$) voltage generating means connected in parallel with each other for generating a plurality of trial voltages of a polarity opposite to that of the signal voltage addition means for adding said trial voltages one at a time in decreasing order of magnitude to said signal voltage to form cumulative sum voltages at each addition step, each of said voltage generating means comprising reference voltage means $Sm$, a voltage divider gating means selectively actuated to couple said reference voltage to said voltage divider, each said voltage divider comprising a first resistor $Ai$, a second resistor $Bi$ connected in series therewith to ground, and a third resistor $Ci$ connecting the junction of $Ai$ and $Bi$ to said addition means, the values of $Ai$, $Bi$ and $Ci$ for each of the $i$ voltage dividers being related to each other and satisfying the equations $$\frac{Bi}{Ai + Bi} = 2^{i-10} \text{ and } \frac{Ai\ Bi}{Ai + Bi} + Ci = K$$

where $K$ is a constant, polarity sensing means for determining at each addition step the polarity of said cumulative sum voltage, digit generating means for generating a logical 1 if the cumulative sum voltage after a particular addition step is of one polarity and generating a logical 0 if said cumulative sum voltage after that particular addition step is of a polarity opposite to said one polarity, means responsive to the generation of said logical 1 to continue adding that particular trial voltage to said cumulative sum voltage at succeeding addition steps, whereby each addition step directly and sequentially generates one digit of a digital number corresponding to the magnitude of the signal voltage.

2. The system of claim 1 including a load resistor forming said addition means, whereby said cumulative sum voltage appears across said load resistor, said gate associated with each of said voltage dividers having a logical gating input, said voltage reference means associated with each of said gates adapted to energize said associated voltage divider in response to a logical 1 input on said logical gating input.

3. The system of claim 2 wherein said polarity sensing means comprises a voltage threshold detector coupled across said load resistor, said voltage threshold detector conducting and generating a polarity change pulse in response to a cumulative sum voltage of a polarity opposite to said one polarity.

4. The system of claim 3 wherein said digit generating means comprises a plurality of triggers, one for each of said voltage dividers, each of said triggers having a logical output coupled to the logical gating input of the gate for one of said voltage dividers, each of said triggers also having a reset change to 0-state input and a set change to 1-state input, means for successively setting each of the triggers to the 1-state and then resetting said trigger to the 0-state if and only if said polarity change pulse is generated by said polarity sensing means.

* * * * *